United States Patent
Booth et al.

(10) Patent No.: US 9,830,257 B1
(45) Date of Patent: Nov. 28, 2017

(54) FAST SAVING OF DATA DURING POWER INTERRUPTION IN DATA STORAGE SYSTEMS

(71) Applicant: Western Digital Technologies, Inc., Irvine, CA (US)

(72) Inventors: Jing Booth, San Jose, CA (US); Stephen J. Silva, Fort Collins, CO (US); Justin Ha, San Francisco, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 101 days.

(21) Appl. No.: 13/967,292

(22) Filed: Aug. 14, 2013

Related U.S. Application Data

(60) Provisional application No. 61/834,229, filed on Jun. 12, 2013.

(51) Int. Cl.
*G06F 12/02* (2006.01)
*G11C 14/00* (2006.01)

(52) U.S. Cl.
CPC ...... *G06F 12/0246* (2013.01); *G11C 14/0018* (2013.01); *G11C 14/0063* (2013.01)

(58) Field of Classification Search
None
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,037,232 B2 | 10/2011 | Chu |
| 8,078,918 B2 | 12/2011 | Diggs et al. |
| 8,090,899 B1 | 1/2012 | Syu |

(Continued)

*Primary Examiner* — Sean D Rossiter
*Assistant Examiner* — Charles Choi
(74) *Attorney, Agent, or Firm* — McDermott Will & Emery LLP

(57) ABSTRACT

Embodiments of systems and methods that ensure integrity of data during unexpected power interruption of loss are disclosed. In some embodiments, critical data is saved quickly and efficiently using backup power. Data integrity is ensured even when the reliability of backup power sources is an issue. In some embodiments, by skipping the updating and saving of system data while operating on backup power, significant reduction of time for saving critical data can be achieved. System data can be restored next time the data storage system is restarted. Improvements of data storage system reliability are thereby attained.

19 Claims, 5 Drawing Sheets

(56) References Cited

U.S. PATENT DOCUMENTS

| | | |
|---|---|---|
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,316,257 B2 | 11/2012 | Royer et al. |
| 8,341,339 B1 | 12/2012 | Boyle et al. |
| 8,375,151 B1 | 2/2013 | Kan |
| 8,380,944 B2 | 2/2013 | Dumitru et al. |
| 8,380,945 B2 | 2/2013 | Ye et al. |
| 8,392,635 B2 | 3/2013 | Booth et al. |
| 8,397,101 B2 | 3/2013 | Goss et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 9,201,783 B2* | 12/2015 | Song ............... G06F 12/0246 |
| 9,286,198 B2* | 3/2016 | Bennett |
| 2006/0072369 A1* | 4/2006 | Madter et al. ............... 365/232 |
| 2009/0327589 A1* | 12/2009 | Moshayedi ......... G06F 11/1441 711/103 |
| 2010/0174849 A1 | 7/2010 | Walston et al. |
| 2010/0217920 A1* | 8/2010 | Song ............... G06F 12/0246 711/103 |
| 2010/0250793 A1 | 9/2010 | Syu |
| 2011/0099323 A1 | 4/2011 | Syu |
| 2011/0239043 A1* | 9/2011 | Vedder et al. ............... 714/14 |
| 2011/0283049 A1 | 11/2011 | Kang et al. |
| 2012/0239853 A1* | 9/2012 | Moshayedi ............... 711/103 |
| 2012/0254503 A1 | 10/2012 | Chiu et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2015/0012690 A1* | 1/2015 | Bruce et al. ............... 711/103 |

* cited by examiner

FAST SAVING OF DATA DURING POWER INTERRUPTION IN DATA STORAGE SYSTEMS

CROSS REFERENCE TO RELATED APPLICATIONS

This application claims priority to provisional U.S. Patent Application Ser. No. 61/834,229, filed on Jun. 12, 2013, which is hereby incorporated by reference in its entirety.

BACKGROUND

Technical Field

This disclosure relates to data storage systems for computer systems. More particularly, the disclosure relates to fast saving of data during power interruption.

Description of the Related Art

Data storage systems maintain host data and system data in memory. During operation, certain data is maintained in volatile memory. When power loss or interruption is experienced, data should be moved from volatile memory to non-volatile memory in order to maintain data integrity. It is desirable to provide more efficient mechanisms for saving data during power loss and maintaining data integrity.

BRIEF DESCRIPTION OF THE DRAWINGS

Systems and methods that embody the various features of the invention will now be described with reference to the following drawings, in which.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

A data storage system may experience unexpected power interruption or power loss during which the data storage system may operate using backup power. A backup power source may provide power for only a short duration of time during which the data storage system needs to save critical data to ensure integrity of the data. Disclosed systems and methods can ensure data integrity even when the reliability of backup power sources is an issue. In one embodiment, by skipping the updating and saving of system data while operating on backup power, significant reduction of time for saving critical data can be achieved. System data can be restored next time the data storage system is restarted.

System Overview

Figure 1:
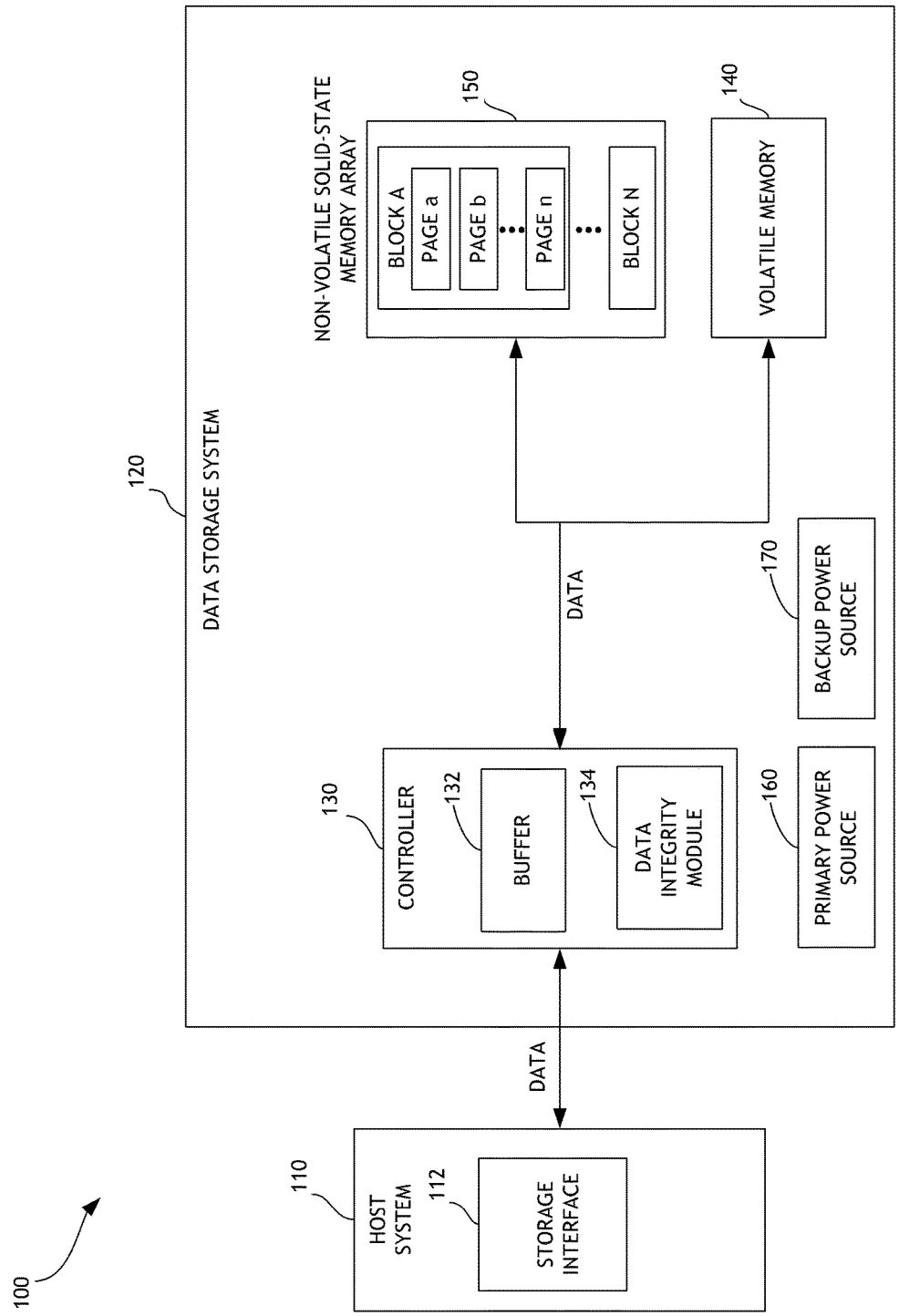
FIG. 1 illustrates a combination of a host system and a data storage system according to one embodiment.

FIG. 1 illustrates a combination 100 of a host system and a data storage system according to one embodiment of the invention. As is shown, the data storage system 120 (e.g., a solid-state drive) includes a controller 130, volatile memory 140, and a non-volatile solid-state memory array 150. Volatile memory 140 may comprise random access memory (RAM), static random-access memory (SRAM), dynamic random-access memory (DRAM), synchronous dynamic random-access memory (SDRAM), such as DDR3, or any combination thereof. The solid-state memory array 150 may comprise flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. Data storage system 120 can further include other types non-volatile and/or volatile storage, such as magnetic storage.

In some embodiments, non-volatile solid-state memory array 150 is divided into physical blocks, which are further divided into physical pages (or F-pages). A block (such as blocks A through N) can represent the smallest grouping of memory cells that can be erased in a single operation or as a unit, and a page (such as pages a, b, through n) can represent the smallest grouping of memory cells that can be programmed in a single operation or as a unit. While a single memory array 150 is illustrated for convenience, the data storage system 120 may include a plurality of memory arrays.

The controller 130 can be configured to receive data and/or storage access commands from a storage interface module 112 (e.g., a device driver) of a host system 110. Storage access commands communicated by the storage interface module 112 can include write data and read data commands issued by the host system 110. Read and write commands can specify a logical address (e.g., logical block addresses or LBAs) used to access the data storage system 120. The controller 130 can execute the received commands in the memory array 150.

Data storage system 120 can store data communicated by the host system 110. In other words, the data storage system 120 can act as memory storage for the host system 110. To facilitate this function, the controller 130 can implement a logical interface. The logical interface can present to the host system 110 data storage system's memory as a set of logical addresses (e.g., contiguous address) where host or user data can be stored. Internally, the controller 130 can map logical addresses to various physical locations or addresses in the memory 150. The controller 130 includes a buffer 132, which can comprise volatile memory, such RAM, SRAM, DRAM, SDRAM, etc. In one embodiment, the buffer 132 is external to the controller 130. The controller 130 also includes a data integrity module 134 configured to monitor and maintain the integrity of data stored in the data storage system 120. In some embodiments, the data integrity module 134 maintains integrity of the data when the data storage system 120 experiences a power interruption or loss condition.

In some embodiments, buffer 132 (or volatile memory 140) can be utilized as cache memory, such as write cache buffer for the memory array 150. For example, even if the data storage system 120 does not claim support for write cache or expose write cache to the host system 110 or when the host system 110 does not request or enable write cache support, the data storage system 120 may still cache a small amount of host data for various reasons, such as in order to improve write performance. In such cases, however, the data storage system 120 should ensure integrity of host data, particularly in the event that the data storage system experiences a sudden or unexpected power loss. That is, the data storage system 120 should move cached host data from the buffer 132 to the non-volatile memory 150.

Data storage system 120 includes a primary power source 160 and a backup power source 170. The primary power source 160, which can be an alternating current (AC) or direct current (DC) power source, is configured to provide power to the data storage system 120 during normal operation. The backup power source is configured to provide temporary power to the data storage system 120 when primary power is interrupted or lost. The backup power source can include one or more power storage devices. In one embodiment, the backup power source includes one or more capacitors, such as one or more onboard capacitors or super-capacitors.

In some embodiments, the data storage system 120 maintains a map or mapping between logical addresses used by the host system 120 and physical memory locations in the non-volatile solid-state memory array 150. The mapping may be maintained as a table and/or any other suitable data structure. Physical memory location corresponding to a given logical address (e.g., LBA) may change as a result of host data being moved. For example, host data can be moved within the memory array 150 due to one or more housekeeping operations, such as garbage collection (e.g., reclaiming memory space used by invalid data), wear leveling (e.g., spreading out the write load substantially evenly across memory pages and/or blocks), memory refresh (e.g., periodically refreshing stored data), bad block management (e.g., discovering and not using for storage unreliable memory blocks), etc. In addition, when the host system 110 writes data for a particular logical address, the mapping for this logical address usually changes because data is stored in a different physical memory location. For example, the host system 110 can store data for a LBA, which is programmed in physical address 102,167. At a later time, the host system 110 can update the data for the LBA, which is written to physical address 1,029. Data stored at physical address 102,167 becomes invalid, and mapping for the LBA is updated to reflect the physical address 1,029 where latest data is stored.

In certain embodiments, the data storage system 120 records or tracks the changes to the mapping, such as the change described in the above example, in a mapping table. The mapping table can be structured to provide a look-up of a physical address corresponding to a logical address, and the table can be indexed based on the logical addresses. In various embodiments, the table is indexed based on physical addresses. In some embodiments, the data storage system 120 further creates metadata that provides logical-to-physical mapping and stores the metadata along with host data in memory. This can be advantageous for performing reverse lookup, such as during execution of housekeeping operations, in cases when the mapping table is indexed based on the logical addresses. For example, the data storage system 120 can use the metadata to determine which logical address a particular physical address corresponds to.

Figure 2:
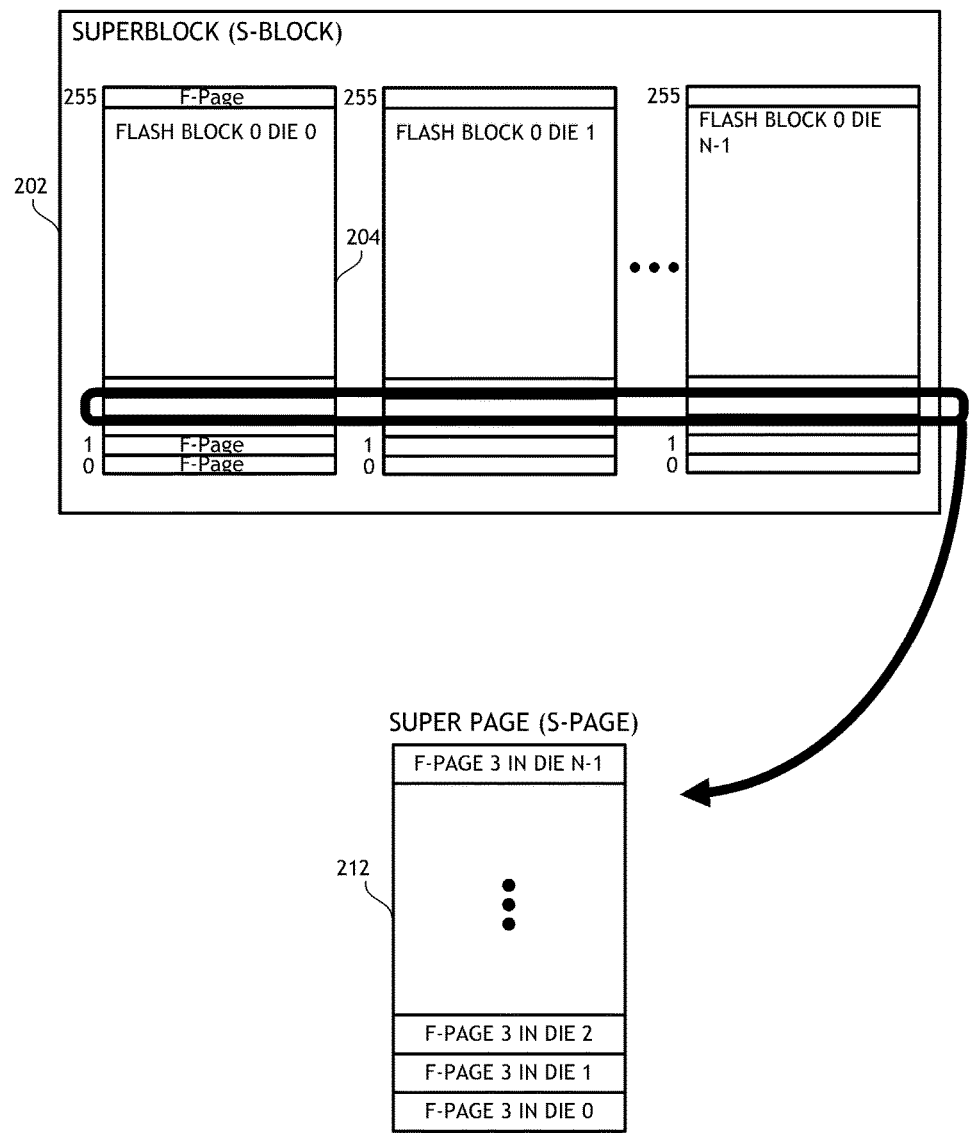
FIG. 2 illustrates organization of non-volatile solid-state memory array into Super Blocks (S-Blocks) according to one embodiment.

In certain embodiments, non-volatile solid-state memory array 150 includes multiple channels and each channel contains multiple dies. The dies can be accessed (read or programmed) concurrently, and utilizing the dies concurrently can increase performance. In order to take advantage of this parallelism, the memory array 150 blocks can be organized into Super Blocks. FIG. 2 illustrates organization of the non-volatile solid-state memory array 150 into Super Blocks (S-Blocks) according to one embodiment. As shown therein, S-Block 202 may comprise one block 204 (as also shown in FIG. 1) per die. S-Block 202, therefore, may be thought of as a collection of blocks 204, one block per die, that are combined together to form a unit of a flash management system. While a single Super Block 202 is illustrated for convenience, the memory array 150 may include a plurality of Super Blocks. According to one embodiment, allocation of memory for storing data, erasure, and housekeeping operations may be managed at the Super Block level. For example, when host write commands are received, the data storage system 120 can distribute programming operations among the blocks in a Super Block so that host data can be programmed into the memory array 150 concurrently to maximize performance. Each block 204, as shown in FIG. 2, may comprise a plurality of pages such as, for example, 256 or 512 pages. FIG. 2 shows a Super Page (S-Page), according to one embodiment. As shown therein, S-Page 212 may comprise one page per block of an S-Block, meaning that S-Page 212 spans across the entire S-Block 202. In some embodiments, an S-Block can include multiple blocks per die. For example, for dual plane solid-state memory, an S-Block can include two blocks per die. As another example, for quad plane solid-state memory, an S-Block can include four blocks per die.

Figure 3:
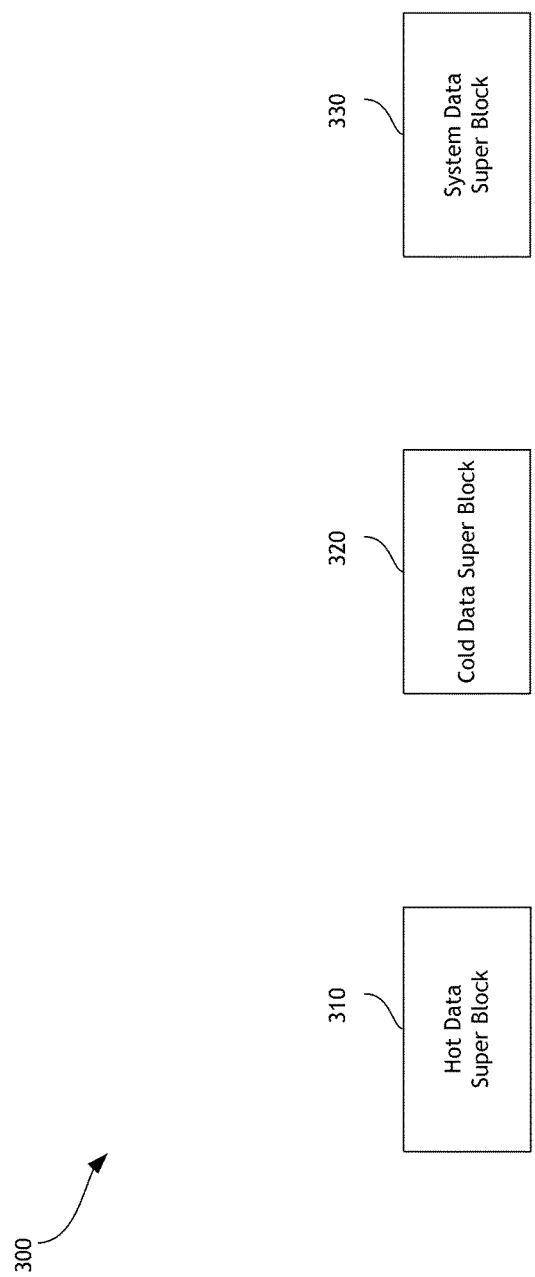
FIG. 3 illustrates organization of Super Blocks from a data band and a system band according to one embodiment.

In some embodiments, the data storage system 120 maintains bands for various types of data stored in the non-volatile solid-state memory array 150. Bands may be collections of Super Blocks managed together as independent flash management system. The data storage system 120 can maintain a data band and a system band. A data band can contain host data and may include hot and cold blocks for storing, respectively, incoming data received from the host and valid data that has been garbage collected. System band contains non-host system data, such as flash management system data, metadata, and the like. FIG. 3 illustrates organization of Super Blocks 300 from the data band and system band according to one embodiment. As is shown, Hot Data Super Block 310 and Cold Data Super Block 320 are part of the data band, and can correspond to active Super Blocks for storing hot and cold host data respectively. System Data Super Block 330 is part of system band, and can correspond to active Super Block for storing system data.

In certain embodiments, the data storage system 120 maintains a Super Block Journal (S-Journal) which contains mapping information for a Super Block. For example, S-Journal contains logical-to-physical (and/or physical-to-logical) mapping information for a given Super Block, and S-Journal can be used to track the host data written to the given superblock in the data band. Effectively, S-Journal includes a history of host commands ordered chronologically. S-Journal data can be periodically flushed or written to the non-volatile solid-state memory array 150, such as written to the system band. According to one embodiment, the S-Journal may constitute main flash management data written to the media.

In some embodiments, because the logical-to-physical mapping may be stored or kept in the volatile memory 140, such as for faster access, it necessarily must be rebuilt upon startup or any other loss of power to the volatile memory. This, therefore, requires some mechanism and information to be stored in a non-volatile memory that will enable the data storage system 120 to reconstruct the logical-to-physical mapping before the data storage system (e.g., via the controller 130) can "know" where logical data is stored in the non-volatile solid-state memory array 150 after startup and/or after a power-fail event. According to one embodiment, such mechanism and information may be embodied the S-Journal. In one embodiment, each S-Journal may cover a pre-determined range of physical pages, and each S-Journal may comprise a plurality of journal entries, with each entry being configured to associate one or more physical pages to a logical page. According to one embodiment, each time the data storage system 120 is powered-up, restarted, or whenever the logical-to-physical mapping needs to be rebuilt, the controller 130 reads S-Journal data (e.g., from the system band) and, using the information stored in S-Journal entries, rebuilds the logical-to-physical mapping. The mapping may then be loaded into the volatile memory 140.

Saving of Data During Power Interruption or Loss

In various embodiments, incoming (or hot) host data can be partially of fully cached in the buffer 132 before being written to the non-volatile solid-state memory array 150. Upon normal shutdown or restart of the data storage system 120, it may save or flush host data from the buffer 132 to the non-volatile memory array 150 along with performing other shutdown operations, including for example updating the logical-to-physical mapping, creating S-Journal data (or logical-to-physical mapping) and updating the S-Journal, and saving other system data. When power is lost or interrupted, the data storage system 120 may be powered by the backup power source 170. In some embodiments, the backup power source 170 provides power for a short period of time, and hence the data storage system 120 needs to perform shutdown operations quickly before power has been exhausted.

In some embodiments, the process of saving data during power interruption or loss is performed faster and more efficiently by flushing host data from the buffer 132 along with a metadata or header that includes, for example, logical-to-physical mapping. In certain embodiments, the header can include physical-to-logical-mapping or a combination of physical-to-logical and logical-to-physical mapping. For example, suppose that X is the Super Block location or number of the currently active Super Block from the hot data band (e.g., X may correspond to Super Block 310 illustrated in FIG. 3). Let Y be the next Super Block from the hot data band for storing host data. When the data storage system 120 loses power, because the amount of cached host data is generally small, this data should fit into Super Block numbers X and Y. The data storage system 120 (e.g., via the controller 130) saves Super Block numbers X and Y as part of system data and writes host data along with mapping metadata (e.g., logical-to-physical header) to Super Block numbers X and Y. In one embodiment, Super Block number X alone may be sufficient for saving cached host data.

Figure 4:
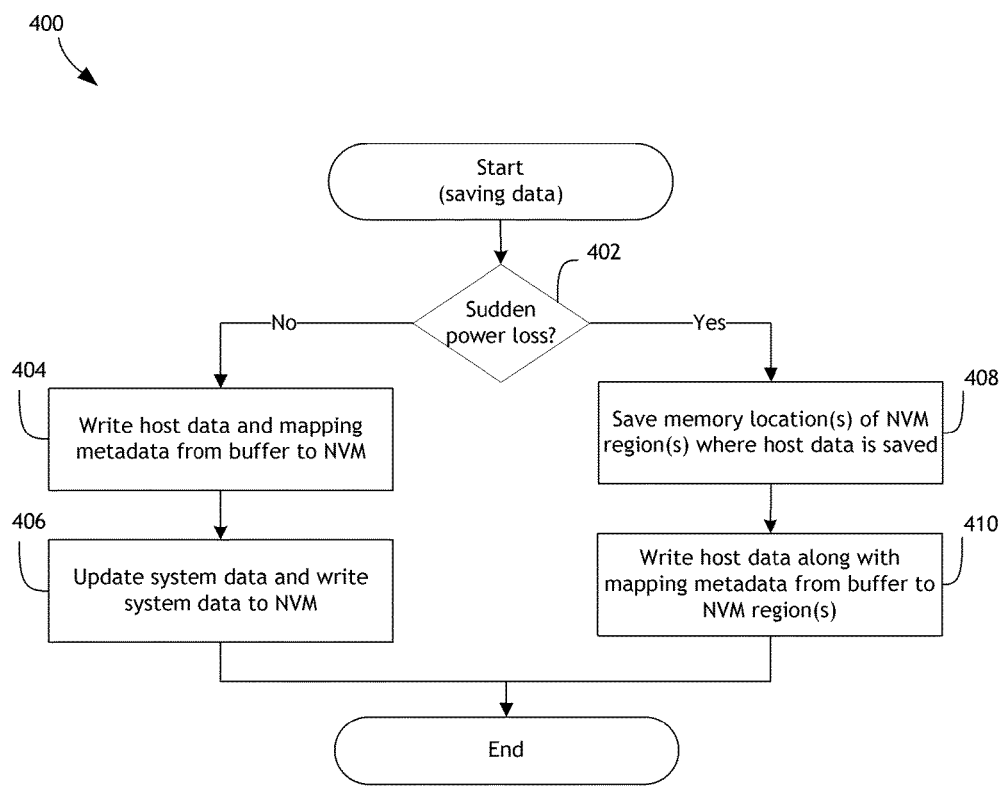
FIG. 4 illustrates a process of saving data when power is lost according to one embodiment.

FIG. 4 illustrates a process 400 of saving data when power is lost according to one embodiment. The process 400 can be executed by the controller 130 and/or the data integrity module 134. The process 400 begins in block 402 where it determines whether a sudden or unexpected power loss or interruption has occurred. In one embodiment, this determination is made by interrogating the primary power source 160 to determine whether it continues to supply power. If loss of power is not unexpected, the process 400 proceeds with normal shutdown operation. In blocks 404 and 406 respectively the process 400 saves to the non-volatile solid-state memory array 150 cached (or hot) host data and parts or entirety of system data that is stored in volatile memory. In block 404, the process 400 writes host data and mapping data to the non-volatile solid-state memory array 150. Mapping data can include one or more headers with mapping data, such as logical-to-physical mapping. The mapping may takes up N bytes (where N is a small integer number) for each solid-state memory page. In block 406 the process 400 updates system data, such as the logical-to-physical mapping and the S-Journal to reflect writing of host data in block 404, and saves the updated S-Journal data to the memory array 150.

If in block 402 the process 400 determines that power was lost or interrupted unexpectedly (and the data storage system 120 is operating on backup power), the process transitions to block 408 where it saves memory locations of non-volatile memory array 150 regions where host data will be (or has already been) flushed. The amount of data saved in block 408 is small in comparison with system data updated and saved in block 406. The process 400 can quickly save the minimum amount of data in block 408. In one embodiment, the process 400 saves this information to a boot block in the non-volatile solid-state memory array 150 where start-up or boot data is saved. Boot block can be a fixed known location that is accessed statically or can be a block that is accessed dynamically via, for example, a pointer. Boot block can be a page, collection of pages, block, collection of blocks (e.g., Super Block), etc. In one embodiment, the process 400 saves critical system data to the boot block so that the data storage system 120 can restart correctly and so that data integrity is maintained on restart after power loss. For example, the process 400 can save the following data to the boot block: Super Block numbers X and Y, atomic write information (e.g., table and/or sequence number), and file system directory. Atomic write information is saved in case the host system 110 requested an atomic write operation during which the power interruption or loss event occurred, so that atomic write data can be rolled back when the data storage system 120 restarts. In one embodiment, saved system data fits into a page of the memory array 150. The process 400 transitions to block 410 where it writes cached (or hot) host data to the memory array 150. For example, host data can be programmed in Super Block numbers X and Y. The process 400 also stores one or more headers with mapping data (or metadata), such as logical-to-physical mapping. The mapping may takes up N bytes (where N is a small integer number) for each solid-state memory page. In one embodiment, process 400 performs the same operations in block 410 as in block 404.

In some embodiments, when an unexpected power loss event occurs, the data storage system 120 saves cached host data without updating the logical-to-physical mapping or the S-Journal. Not performing these updates saves time. In one embodiment, system and cold data bands are closed or shutdown when unexpected power loss event is detected. In addition, because system data stored in the volatile memory 140 (e.g., S-Journal) is not updated, volatile memory 140 can be powered off or shutdown earlier to save power, provided that operations in blocks 408 and 410 do not utilize the volatile memory or after the volatile memory no longer needs to be accessed. For example, the volatile memory 140 can be powered off when cached host data has been saved in the non-volatile memory array 150 and/or otherwise retrieved from the volatile memory. In one embodiment, volatile memory 140 comprises more than one portion (e.g., module), and one portion of the volatile memory 140 is used for caching host data. Such caching portion of the volatile memory 140 can be one or more DDR modules. The caching portion of the volatile memory 140 can be powered off or shutdown (e.g., by turning of the clock signal(s)) when cached host data has been saved in the non-volatile memory array 150 and/or otherwise retrieved from the volatile memory. Other portions of the volatile memory 140 may continue to be operational, for example, for use by the controller 130.

Resuming Operation Following Power Interruption or Loss

In various embodiments, when the data storage system 120 resumes normal operation (powered by the primary power source 160), it needs to restore the system data that was not saved during unexpected power interruption or loss. For example, the mapping needs to be restored. In one embodiment, the data storage system 120, via the controller 130, accesses the boot block and determines the location of Super Blocks numbers X and Y using saved Super Block numbers. Super Blocks numbers X and Y are scanned for header data that contains mapping data, and mapping data is used to restore the logical-to-physical mapping.

Figure 5:
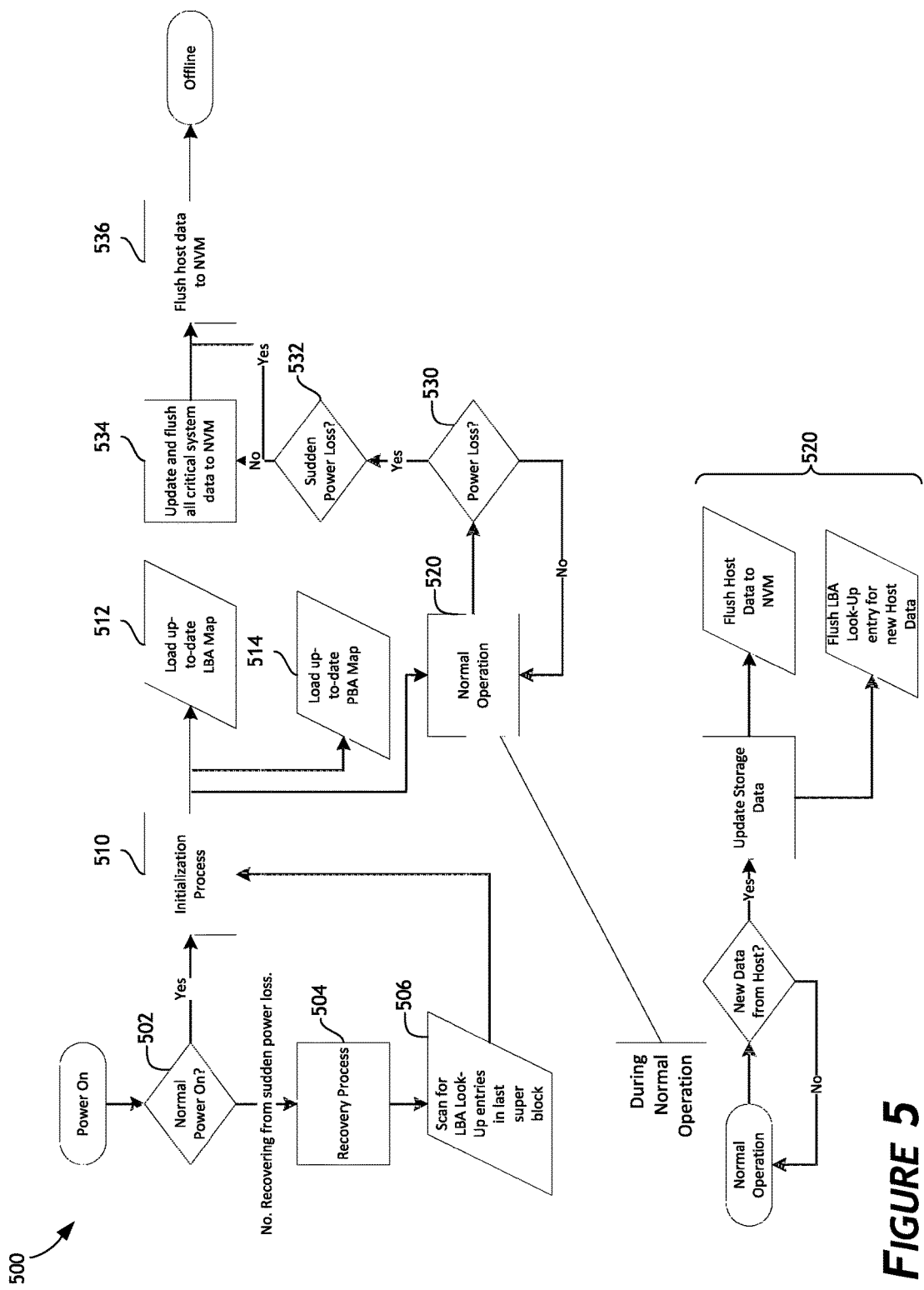
FIG. 5 illustrates a process of data storage system operation according to one embodiment.

FIG. 5 illustrates a process 500 of data storage system 120 operation according to one embodiment. The process 500 can be executed by the controller 130 and/or the data integrity module 134. In block 502, the process 500 determines whether the data storage system 120 was powered on following a normal shutdown. If the process 500 determines that the data storage system 120 was powered on following an unexpected power interruption or loss event, the process 500 transitions to block 504 where recovery is performed. In block 506, the process scans Super Blocks numbers X and Y for mapping data header(s). This scan can be done sequentially or can be assisted by the hardware. For example, performing the scan can be offloaded to a hardware module. Then, the process 500 transitions to block 510 where it initializes the data storage system 120. If in block 502 the process 500 determines that the data storage system 120 restarted following normal shutdown, the process 500 transitions to block 510.

In block 510, the process 500 initializes the data storage system 120 by loading in block 512 updated logical-to-physical map (indexed by logical addresses or LBAs) and by loading in block 514 updated physical-to-logical map (indexed by physical addresses or PBAs). Logical-to-physical map can be reconstructed from saved system data and can be loaded into the volatile memory 140. For example, logical-to-physical map can be reconstructed from saved S-Journal. The process 500 transitions to block 520 where normal operation of the data storage system 120 resumes. As is illustrated, the data storage system 120 can, for instance, store incoming host data in the non-volatile solid-state memory array 150 and also store logical-to-physical mapping entry corresponding to stored incoming host data.

In block 530, the process 500 determines whether power interruption or loss condition has occurred. If no such condition has occurred, the process 500 transitions back to block 520. If power interruption or loss condition has occurred, the process 500 determines in block 532 whether this condition is unexpected. If not, the process 500 transitions to block 534 where it updates and saves in the memory array 150 critical system data. The process 500 then transitions to block 536, where it saves cached (or hot) host data in the memory array 150. In one embodiment, the process 500 also generates and saves one or more headers with mapping data to the memory array 150 along with cached host data. The process 500 shuts down the data storage system 120. If in block 532 the process 500 determines that the power interruption or loss condition is unexpected, the process transitions to block 536 where it saves cached host data as explained above.

CONCLUSION

Disclosed systems and methods ensure integrity of data during unexpected power interruption of loss. Critical data is saved quickly and efficiently using backup power. Disclosed systems and methods can advantageously ensure data integrity even when the reliability of backup power sources, such as power capacitors, is an issue. In one embodiment, by skipping the updating and saving of system data while operating on backup power, significant reduction of time for saving critical data can be achieved. System data can be restored next time the data storage system is restarted. Accordingly, improvements of data storage system reliability are attained. In addition, performance is a data storage system is increased.

Other Variations

Those skilled in the art will appreciate that in some embodiments, other approaches and methods can be used. For example, additional or alternative data may be saved during power interruption of loss. The data storage system can be a hard disk drive, hybrid hard disk, etc. The actual steps taken in the disclosed processes, such as the processes illustrated in FIGS. 4 and 5, may differ from those shown in the figures. Additional system components can be utilized, and disclosed system components can be combined or omitted. Depending on the embodiment, certain of the steps described above may be removed, others may be added.

While certain embodiments of the disclosure have been described, these embodiments have been presented by way of example only, and are not intended to limit the scope of the disclosure. Indeed, the novel methods, devices and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. For example, those skilled in the art will appreciate that in various embodiments, the actual physical and logical structures may differ from those shown in the figures. Depending on the embodiment, certain steps described in the described examples and processes may be performed in different order, removed, and others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A non-volatile data storage system, comprising:
a non-volatile memory array comprising a plurality of memory die;
a volatile memory; and
a controller configured to:
 maintain a mapping associating a set of physical addresses in the non-volatile memory array where host system data is stored with a set of logical addresses, wherein at least a portion of the mapping is stored in the volatile memory during operation, detect, on an indication of a power shutdown, whether the power shutdown is an unexpected interruption of power or an expected interruption of power, in response to detecting the unexpected interruption of power, write host system data stored in the volatile memory along with one or more mapping data headers to one or more first memory locations in one or more super blocks of the non-volatile memory array, each superblock comprising a plurality of memory blocks in multiple memory die of the plurality of memory die, the one or more mapping data headers comprising physical addresses of second memory locations within the non-volatile memory array that are designated for storing the host system data written to the one or more first memory locations in response to detecting the unexpected interruption of power, the first memory locations being different than the second memory locations, the host system data and one or more mapping data headers being written without updating the mapping or storing mapping updates in the non-volatile memory array, and upon resuming operation following the unexpected interruption of power, scan the one or more superblocks for the one or more mapping data headers comprising the physical addresses of the second memory locations.

2. The non-volatile data storage system of claim 1, wherein the one or more mapping data headers comprises one or more logical addresses associated with host system data stored in the volatile memory and written to the non-volatile memory array.

3. The non-volatile data storage system of claim 2, wherein, upon resuming operation following the unexpected interruption of power, the controller is further configured to update the mapping using the one or more mapping data headers.

4. The non-volatile data storage system of claim 1, wherein the controller is further configured to:

in response to detecting the unexpected interruption of power, store in a boot memory region of the non-volatile memory array identification information corresponding to one or more non-volatile memory array regions where host system data stored in the volatile memory is written.

5. The non-volatile data storage system of claim 4, wherein, upon resuming operation following the unexpected interruption of power, the controller is further configured to update the mapping using the one or more mapping data headers metadata.

6. The non-volatile data storage system of claim 5, further comprising a hardware module configured to scan the one or more non-volatile memory array regions where host system data stored in the volatile memory was written for the one or more mapping data headers.

7. The non-volatile data storage system of claim 1, further comprising a primary power source configured to provide power during operation and a backup power source configured to provide power during the unexpected interruption of power provided by the primary power source.

8. The non-volatile data storage system of claim 7, wherein the backup power source comprises one or more of capacitors or other power storage devices.

9. The non-volatile data storage system of claim 1, wherein the controller is further configured to:

in response to detecting the expected interruption of power, perform shutdown operations comprising writing host system data stored in the volatile memory to the non-volatile memory array, updating the mapping, and storing mapping updates in the non-volatile memory array.

10. The non-volatile data storage system of claim 1, wherein the controller is further configured to power off the volatile memory after host system data stored in the volatile memory has been stored in the non-volatile memory array.

11. In a non-volatile data storage system comprising a controller, a volatile memory, and a non-volatile memory array comprising a plurality of memory die, a method of storing data, the method comprising:

maintaining a mapping associating a set of physical addresses in the non-volatile memory array where host system data is stored with a set of logical addresses, wherein at least a portion of the mapping is stored in the volatile memory during operation;

detect, on an indication of a power shutdown, whether the power shutdown is an unexpected interruption of power or an expected interruption of power;

in response to detecting an unexpected interruption of power, writing host system data stored in the volatile memory along with one or more mapping data headers to one or more first memory locations in one or more super blocks of the non-volatile memory array, each superblock comprising a plurality of memory blocks in multiple memory die of the plurality of memory die, the one or more mapping data headers comprising physical addresses of second memory locations within the non-volatile memory array that are designated for storing the host system data written to the one or more first memory locations in response to detecting the unexpected interruption of power, the first memory locations being different than the second memory locations, the host system data and one or more mapping data headers being written without updating the mapping or storing mapping updates in the non-volatile memory array; and upon resuming operation following the unexpected interruption of power, scanning the one or more superblocks for the one or more mapping data headers comprising the physical addresses of the second memory locations, wherein the method is performed under control of the controller.

12. The method of claim 11, wherein the one or more mapping data headers comprises one or more logical addresses associated with host system data stored in the volatile memory and written to the non-volatile memory array.

13. The method of claim 12, further comprising updating the mapping using the one or more mapping data headers upon resuming operation following the unexpected interruption of power.

14. The method of claim 11, further comprising:

in response to detecting the unexpected interruption of power, storing in a boot memory region of the non-volatile memory array identification information corresponding to one or more non-volatile memory array regions where host system data stored in the volatile memory is written.

15. The method of claim 14, further comprising:

upon resuming operation following the unexpected interruption of power updating the mapping using the one or more mapping data headers.

16. The method of claim 11, further comprising providing power during operation from a primary power source and providing power during the unexpected interruption of power provided by the primary power source from a backup power source.

17. The method of claim 16, wherein the backup power source comprises one or more of capacitors or other power storage devices.

18. The method of claim 11, further comprising:
in response to detecting the expected interruption of power, performing shutdown operations comprising writing host system data stored in the volatile memory to the non-volatile memory array, updating the mapping, and storing mapping updates in the non-volatile memory array.

19. The method of claim 11, further comprising powering off the volatile memory after host system data stored in the volatile memory has been stored in the non-volatile memory array.

* * * * *